(12) United States Patent
Zhang et al.

(10) Patent No.: US 9,405,104 B2
(45) Date of Patent: Aug. 2, 2016

(54) SPLIT SUB-PIXEL IMAGING CHIP WITH IR-PASS FILTER COATING APPLIED ON SELECTED SUB-PIXELS

(71) Applicant: GM GLOBAL TECHNOLOGY OPERATIONS LLC, Detroit, MI (US)

(72) Inventors: Wende Zhang, Troy, MI (US); Jinsong Wang, Troy, MI (US); Kent S. Lybecker, Rochester, MI (US); Jeffrey S. Piasecki, Rochester, MI (US); Ryan M. Frakes, Bloomfield Hills, MI (US); Travis S. Hester, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 359 days.

(21) Appl. No.: 14/041,083

(22) Filed: Sep. 30, 2013

(65) Prior Publication Data
US 2014/0176724 A1 Jun. 26, 2014

Related U.S. Application Data

(60) Provisional application No. 61/746,055, filed on Dec. 26, 2012.

(51) Int. Cl.
| | | |
|---|---|---|
| *H04N 5/33* | (2006.01) | |
| *G02B 13/14* | (2006.01) | |
| *H01L 27/146* | (2006.01) | |
| *G02B 13/18* | (2006.01) | |
| *H04N 7/18* | (2006.01) | |
| *B60R 1/00* | (2006.01) | |
| *H04N 9/00* | (2006.01) | |
| *H04N 5/355* | (2011.01) | |
| *G02B 19/00* | (2006.01) | |
| *G02B 5/20* | (2006.01) | |

(52) U.S. Cl.
CPC . *G02B 13/14* (2013.01); *B60R 1/00* (2013.01); *G02B 5/208* (2013.01); *G02B 13/18* (2013.01); *G02B 19/009* (2013.01); *G02B 19/0076* (2013.01); *H01L 27/14618* (2013.01); *H01L 27/14625* (2013.01); *H04N 5/332* (2013.01); *H04N 5/35563* (2013.01); *H04N 7/18* (2013.01); *H04N 9/00* (2013.01); *H01L 2924/0002* (2013.01)

(58) Field of Classification Search
CPC ........ G02B 13/14; G02B 13/18; H04N 5/332; H04N 5/35563; H04N 9/00; H04N 7/18; B60R 1/00; H01L 27/14618; H01L 27/14625; H01L 2924/0002
USPC ......................................................... 348/164
See application file for complete search history.

(56) References Cited

U.S. PATENT DOCUMENTS

2009/0200469 A1* 8/2009 Morin ............... H01L 27/14625
250/338.1
2010/0128129 A1* 5/2010 Kim .................... H04N 5/2226
348/164

(Continued)

OTHER PUBLICATIONS

U.S. Appl. No. 13/835,741, filed Mar. 15, 2013.

(Continued)

*Primary Examiner* — Andy Rao
*Assistant Examiner* — Jared Walker (57) ABSTRACT

An apparatus for capturing an image includes a plurality of lens elements coaxially encompassed within a lens housing. A split-sub-pixel imaging chip includes an IR-pass filter coating applied on selected sub-pixels. The sub-pixels include a long exposure sub-pixel and a short-exposure sub-pixel for each of a plurality of green blue and red pixels.

16 Claims, 4 Drawing Sheets

(56) References Cited

U.S. PATENT DOCUMENTS

| | | | |
|---|---|---|---|
| 2010/0149393 A1* | 6/2010 | Zarnowski | H04N 9/045 348/302 |
| 2011/0122308 A1* | 5/2011 | Duparre | H01L 27/14621 348/340 |
| 2012/0268566 A1* | 10/2012 | Kim | H04N 5/3696 348/46 |

OTHER PUBLICATIONS

U.S. Appl. No. 13/962,156, filed Aug. 8, 2013.

* cited by examiner

SPLIT SUB-PIXEL IMAGING CHIP WITH IR-PASS FILTER COATING APPLIED ON SELECTED SUB-PIXELS

CROSS REFERENCE TO RELATED APPLICATIONS

This application claims the benefit of U.S. Provisional Application No. 61/746,055, filed on Dec. 26, 2012, which is incorporated herein by reference.

TECHNICAL FIELD

This disclosure is related to improving the performance of in-vehicle vision systems.

BACKGROUND

The statements in this section merely provide background information related to the present disclosure. Accordingly, such statements are not intended to constitute an admission of prior art.

Vehicle systems often use in-vehicle vision systems for capturing images representing field of views rearward, forward and/or to the sides of a subject vehicle. It is known, to utilize infrared (IR) light, e.g., IR components within ambient lighting or active IR light sources) obtained by in-vehicle vision systems without an IR cut-off filter to increase visibility during night time driving, or when ambient light is otherwise low. IR light, while not depicting a true color of an image, provides enhanced image sensitivity. Captured images utilizing IR light are often depicted as a colorless image or an image close to a gray-scale. Thus, cameras obtaining IR light often lose color fidelity due to the additional IR components captured in the final image when the IR cut-off filter is not employed.

SUMMARY

An apparatus for capturing an image includes a plurality of lens elements coaxially encompassed within a lens housing. A split-sub-pixel imaging chip includes an IR-pass filter coating applied on selected sub-pixels. The sub-pixels include a long exposure sub-pixel and a short-exposure sub-pixel for each of a plurality of green blue and red pixels.

BRIEF DESCRIPTION OF THE DRAWINGS

One or more embodiments will now be described, by way of example, with reference to the accompanying drawings, in which.

DETAILED DESCRIPTION

Figure 1:
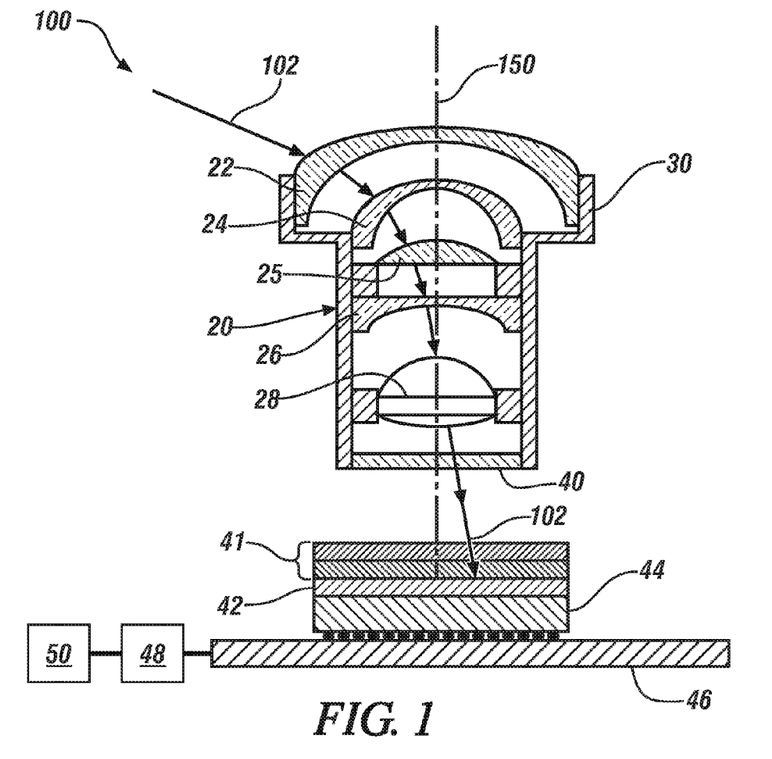
FIG. 1 illustrates an exemplary camera device including a plurality of lens element and an imaging chip coaxially disposed along a longitudinal axis, in accordance with the present disclosure.

Referring now to the drawings, wherein the showings are for the purpose of illustrating certain exemplary embodiments only and not for the purpose of limiting the same, FIG. 1 schematically illustrates a camera device 100 including a lens 20, an infrared (IR) cut-off filter 40, at least one glare-reducing element 41, a cover glass 42, an imaging chip 44 and a camera board 46. A lens housing 30 encompasses the lens 20 that includes a plurality of lens elements 22, 24, 25, 26 and 28. The plurality of lens elements 22-28, the IR cut-off filter 40, the at least one glare reducing element 41, the cover glass 42, the imaging chip 44 and the camera board 46 are coaxial with an optical axis 150. It will be understood that the IR cut-off filter 40 and the at least one glare reducing element 41 are only depicted for illustration, and are not applicable to the embodiments described herein. It will be understood that while the optical axis 150 is "longitudinal" in the illustrated embodiment since a camera coordinate system is defined, the optical axis 150 can include any angle from an origin based on which coordinate system is being defined. For instance, the optical axis 150 can extend from a vehicle rear and include an angle of pitch slightly downward toward the ground when a world coordinate system is defined. Light 102 from a light source sequentially passes through each of the lens elements 22-28, the IR cut-off filter 40, the at least one glare reducing element 41 and the cover glass 42 before being received at the imaging chip 44. In the illustrated embodiment, the cover glass 42 is placed on top of the imaging chip 44. While the term "glass" is used to describe the cover glass 42, it will be understood that polycarbonates or plastics can be utilized instead of glass.

In the embodiments described herein, the camera device 100 is configured to capture a field of view (FOV) rearward of a subject vehicle; however, it should also be understood that the camera device 100 can be extended to capturing a FOV forward of the subject vehicle and to the sides of the subject vehicle. In a non-limiting exemplary embodiment, the camera device 100 is configured to capture a 180° FOV with a downward pitch toward a ground plane a subject vehicle is traveling upon. The camera device 100 is capable of receiving light, or other radiation, and converting the light energy to electrical signals in a pixel format using, for example, one of charged coupled device (CCD) sensors or complimentary metal-oxide-semiconductor (CMOS) sensors. The camera device can be mounted within or on any suitable structure that is part of the vehicle, such as bumpers, spoilers, trunk lids, fascia, grill, side-view mirrors, door panels, etc., as is well understood and appreciated by those skilled in the art. Image data from the camera device 100 can be processed by a non-transitory processing device 48 in signal communication with the camera board 46 to generate an image that can be displayed on any vehicle display units including a rearview mirror display device 50 within the subject vehicle. In one embodiment, the rearview mirror display device 50 is integrated within a human machine interface (HMI) of the vehicle. In another embodiment, the rearview mirror display device 50 is integrated within a rearview mirror mounted on the interior of the subject vehicle.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

The imaging chip 44 can be a color-sensitive imaging chip having an integrated circuit of an array of pixel sensors each including a photodetector and an active amplifier, or the imaging chip 44 can be a monochrome sensor. In one embodiment, the imaging chip is a complementary metal-oxide-semiconductor (CMOS) sensor. In another embodiment, the imaging chip is a charge-coupled device (CCD) sensor and is mounted to a camera board of the camera device. Both CCD and CMOS sensors function by employing photosensitive circuitry that reacts to light and stores analog signals as digital data, i.e., the captured image. The IR cut-off filter 40 can be utilized to block infrared light in a range of wavelengths of wavelengths exceeding a predetermined wavelength. The predetermined wavelength blocking infrared light can include 650 nm in one embodiment. However, the predetermined wavelength is not limited to any one specific value and can include wavelengths of 680 nm or 700 nm in other embodiments envisioned. Therefore, the IR cut-off filter 40 can be removed from the exemplary camera device 100 of FIG. 1.

A CCD sensor is a photosensitive analog device that records light as a small electrical charge in each of its pixels or cells. In essence a CCD is a collection of CCD cells. The CCD circuit may include multiple layers of capacitors (e.g., Stages) for transporting the analog signal to an array of flip-flops for storing the data controlled by a clock signal. Therefore, when light is received by a CCD sensor, the CCD sensor acquires an electrical charge according to how much light has hit the particular CCD cell, wherein each CCD cell can transfer its charge to its neighboring cell and then to external circuitry. An analog-to-digital converter may be employed to read the charge as an integer on a range.

In a CMOS sensor, each pixel has neighboring transistors that locally perform the analog to digital conversion. In one embodiment, each pixel may be an Active Pixel Sensor (APS). Imaging logic is integrated on the CMOS sensor itself, replacing the need for additional circuitry required by CCD sensors to perform the analog-to-digital conversion. Thus, power consumption for operating the CMOS sensor can be reduced. While design of CMOS sensors may be more expensive than CCD sensors due to the integrated circuitry, CMOS sensors can be inexpensively manufactured on any standard silicon production line. One drawback of CMOS sensors is that they are noisier than CCD sensors due to the additional circuitry integrated on the sensor.

Motion blur within captured images can result by long exposure times of the camera device. Exposure times are indicative of the accumulation of light received by the camera device 100. One approach to reduce image motion blurring is to reduce image exposure time and improve image sensitivity. IR cut-off filters block IR light. If an IR cut-off (e.g., IR cut-off filter 40 of FIG. 1) filter is not employed, image sensitivity is increased but color fidelity is reduced. If an IR cut-off filter is employed, image sensitivity is reduced but color fidelity is maintained. It will be understood that increased image sensitivity from the transmission of IR light is desired for capturing images during nighttime or otherwise dark ambient conditions. Accordingly, it is desirable to increase color fidelity for day light driving conditions and to increase or enhance image intensity/sensitivity for night time driving conditions.

Figure 2:
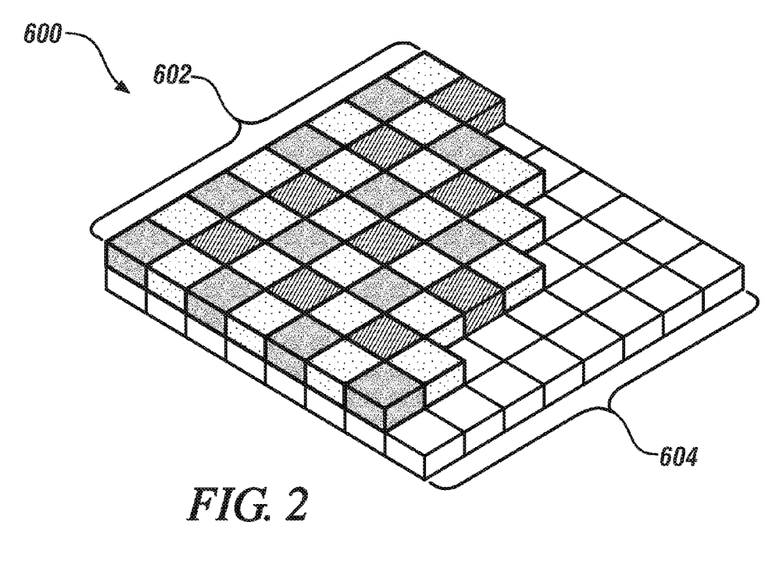
FIG. 2 illustrates a non-limiting example of a color-sensitive imaging chip, in accordance with the present disclosure.

FIG. 2 illustrates a non-limiting example of a color-sensitive imaging chip 600, in accordance with the present disclosure. The color-sensitive imaging chip 600 includes a plurality of color pixels 602 and an imaging chip 604. Each of the pixels 602 is adjustable between one of a short-exposure time and a long-exposure time at a time. In some embodiments, long-exposure times are desirable during low-light or night time ambient conditions to increase the magnitude of light received. The imaging chip 604 can be a CMOS sensor or a CCD sensor. CMOS and CCD sensors are sensitive to wavelengths in the near IR range extending to about 1,000 nm, resulting in unnatural images due to enhanced image sensitivity but poor color information. The plurality of color pixels 602 include green (Gr and Gb), blue (B) and red (R) pixels each having a respective response to light (wavelength). The configuration of the plurality of color pixels enables an increased color sensitivity; however, long exposure times additionally capturing IR light can result in poor color sensitivity that distorts image color fidelity. Accordingly, an IR cut-off filter (e.g., IR cut-off filter 40) can be employed to effectively block IR light at wavelengths exceeding a predetermined wavelength, such that color fidelity is increased. However, blocking IR light reduces image sensitivity that may be desirable during nighttime driving conditions and enhances image motion blur. Therefore, embodiments are envisioned wherein the IR cut-off filter 40 is not employed.

Figure 3:
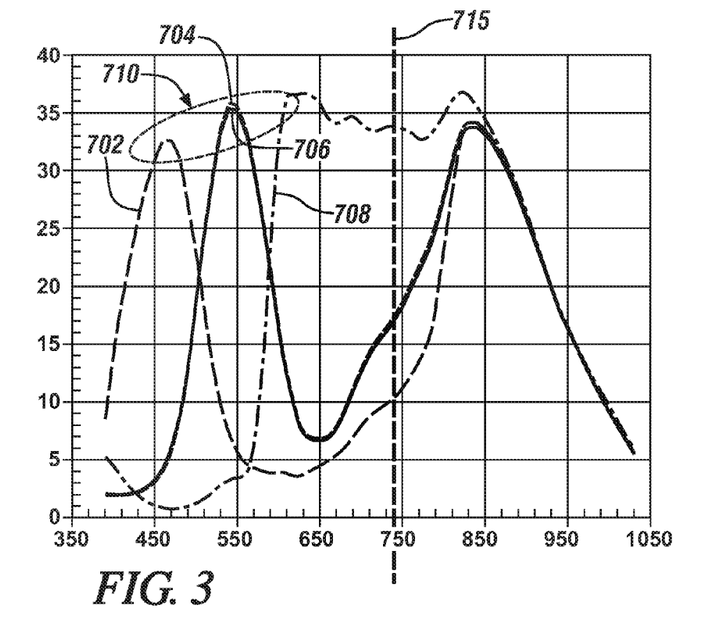
FIG. 3 illustrates a plot of quantum efficiency response profiles of a plurality of colors with respect to wavelength, in accordance with the present disclosure.

FIG. 3 illustrates a plot of quantum efficiency response profiles 702-708 of a plurality of colors with respect to wavelength, in accordance with the present disclosure. As used herein, the term "Quantum Efficiency" (QE), refers to a measurement of an imaging sensor's electrical sensitivity to light. In one embodiment, the imaging sensor includes the imaging chip 600 of FIG. 2. The QE can be measured as a percentage of electrons per photon. Alternatively, QE can be measured in amps per watt. In the illustrated embodiment, the horizontal x-axis denotes wavelength (nm) and the vertical y-axis denotes a QE response (%). Color information is enclosed by dashed area 710 encompassing respective QE response peaks of each of blue (B), green (Gb), green (GR) and red (R) QE response profiles 702, 704, 706, 708, respectively. Dashed vertical line 715 denotes a predetermined wavelength, e.g., 650 nm, at which an IR cut-off filter is employed to block the transmission of IR light at wavelengths exceeding the predetermined wavelength. Accordingly, the region to the right of dashed vertical line represents an IR region providing enhanced image sensitivity information and the region to the left of the dashed vertical line 715 represents a true color or visible region of color information. Thus, without the IR cut-off filter at dashed vertical line 715, imaging chips receive increased energy (e.g., light power) to enhance image sensitivity at a cost of distorting image color fidelity. However, with the IR cut-off filter at dashed vertical line 715, IR light is effectively blocked at wavelengths exceeding dashed vertical line 715 such that image sensitivity is diminished but color fidelity is maintained. It will be understood that reduced image sensitivity is undesirable during night time or low-light driving conditions, and may further contribute to motion blur within captured images.

Figure 4:
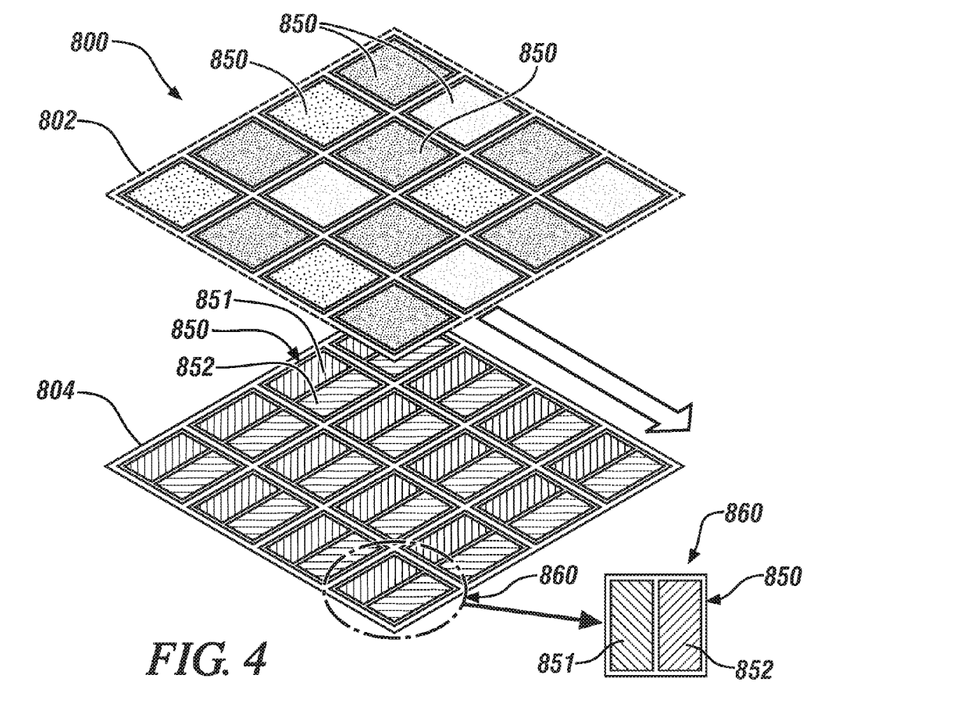
FIG. 4 illustrates an exemplary embodiment of a split sub-pixel imaging chip, in accordance with the present disclosure.

FIG. 4 illustrates an exemplary embodiment of a split sub-pixel imaging chip 800. The split sub-pixel imaging chip 800 includes a color filtering portion 802 and an exposure portion 804. While not separately distinct, the color filtering portion 802 and the exposure portion 804 are separated for purposes of illustration only to describe exemplary embodiments discussed herein. Pixels 850 include green (Gr and Gb), blue (B) and red (R) pixels, each having a respective response to light due to different color filters. For instance, color information is provided by the color filtering portion 802, wherein only green light is permitted to pass through each of the green (Gr and Gb) pixels, only red is permitted to pass through the red (R) pixel, and only blue is permitted to pass through the blue (B) pixel. It will be appreciated that the human eye is more sensitive to green light. Additionally, having a four-pixel color filter (Gr, Gb, B and R) is easier to implement than a 3-pixel color filter. Therefore, two green pixels (e.g., Gr and Gb color filters) are utilized due to the human eye being more sensitive to green light and the desirability to utilize a 4-pixel color filter design. Referring to the exposure portion, each pixel 850 is a split sub-pixel including a short-exposure sub-pixel (S) 851 and a long-exposure sub-pixel (L) 852. Exploded view 860 illustrates the pixel 850 including the short-exposure sub-pixel (S) 851 and the long-exposure sub-pixel (L) 852. A transmission having a higher magnitude of light enters the long-exposure sub-pixel (L) than that of the short-exposure sub-pixel (S). In other words, the long-exposure sub-pixel (L) 852 includes a longer shutter time (or a larger region) to increase the accumulation of light entering the pixel. In a non-limiting embodiment, the long-exposure and short-exposure sub-pixels corresponding to a respective pixel are not equal in size.

Figure 5:
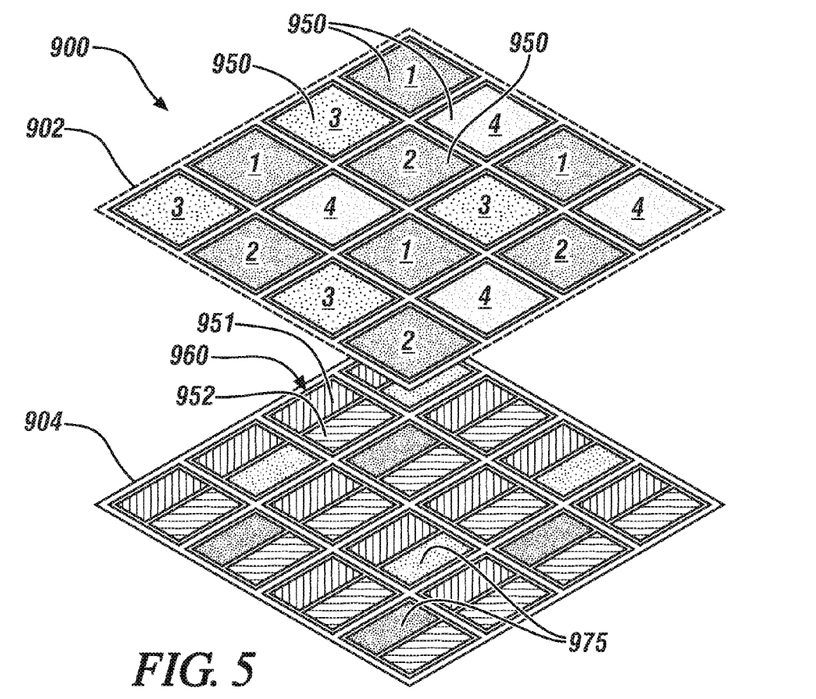
FIG. 5 illustrates an exemplary embodiment of a split sub-pixel imaging chip including an IR-pass filter coating applied on selected sub-pixels, in accordance with the present disclosure.

FIG. 5 illustrates an exemplary embodiment of a split sub-pixel imaging chip including an IR-pass filter coating applied on selected sub-pixels, in accordance with the present disclosure. The split-sub-pixel imaging chip 900 is substantially identical to the split sub-pixel imaging chip 800 of FIG. 4, wherein like numerals describe like features. In the illustrated embodiment, pixels 950 having a "1" denote green (Gr) pixels, pixels 950 having a "2" denote green (Gb) pixels, pixels 950 having a "3" denote red (R) pixels, and pixels 950 having a "4" denote blue (B) pixels. The exposure portion 904 includes an IR-pass filter coating 975 applied on selected sub-pixels. For purposes of illustration, the selected sub-pixels having the IR-pass filter coating 975 applied thereto are represented as shaded, in contrast to sub-pixels not having the IR-pass filter coating applied thereto that are represented as dashed lines. As used herein, the term "IR-pass filter coating" refers to a predetermined portion of wavelengths whereat IR light is allowed to transmit through the selected sub-pixels while visible light including color information is blocked. It will be understood that sub-pixels not having the IR-pass filter applied thereto still allow IR light to be transmitted therethrough, so long as an IR cut-off filter is not employed, but do not block visible light within a specified color spectrum, e.g., within the green (G) color spectrum. In the illustrated embodiment, the predetermined portion of wavelengths includes a predetermined range of wavelengths (e.g., 720-950 nm). However, embodiments are envisioned wherein the predetermined portion of wavelengths includes any wavelengths exceeding a predetermined wavelength (e.g., 720 nm). Embodiments herein are directed toward the imaging chip 41 of the camera device 100 including the split sub-pixel imaging chip 900 of FIG. 5.

Embodiments herein are directed toward the IR-pass filter coating 975 only applied on selected ones of the sub-pixels 951 or 952 for only selected ones of the pixels 950 corresponding to a selected color. In the illustrated embodiment, the selected ones of the pixels 950 corresponding to the selected color include the green (Gr and/or Gb) pixels 950, as denoted by the "1" and "2". However, this disclosure does not limit application of the IR-pass filter coating 975 on selected ones of the red (R) pixels or selected ones of the blue (B) pixels. It will be appreciated that while the exposure portion 904 in the illustrated embodiment of FIG. 5 depicts all short-exposure sub-pixels 951 for the green (Gb) pixels 950 denoted by "2" and all long-exposure sub-pixels 952 for the green (Gr) pixels 950 denoted by "1" as having the IR-pass filter 975 applied thereto, only a portion of these sub-pixels 951 and 952 among the plurality of pixels 950 will have the IR-pass filter applied thereto. This portion will be referred to as the "selected ones" of the pixels corresponding to the "selected color."

Since IR light is allowed to transmit through the selected sub-pixels 951 or 952 within the predetermined range of wavelengths while visible light including color information is blocked therefrom, image sensitivity is effectively separated from true color information. Described in further with respect to flowchart 1100 of FIG. 7, this blocked color information may be reconstructed within a visible spectrum range to enable both true color information and image sensitivity information to be obtained and separated for the selected ones of sub-pixels 951 or 952 of the selected ones of the green (Gr and/or Gb) pixels 950. As described above with reference to the non-limiting exemplary color-sensitive imaging chip 600 of FIG. 2, an un-separated inclusion of both color information and image sensitivity information results in distorted color fidelity and increased image motion blur. Similarly, while employing an IR cut-off filter will preserve and maintain color fidelity, it is at the cost of reducing image sensitivity which is desired during night time and low light driving conditions. Accordingly, application of the IR-pass filter coating on selected sub-pixels enables true color information to be separated from the image sensitivity information, such that the imaging chip 900 (e.g., imaging chip 44 of FIG. 1) maintains image sensitivity and enhances color fidelity. Additionally, image overall exposure time can be reduced to reduce image motion blur. It will be understood that when the camera device 100 does not employ the IR cut-off filter 40 of FIG. 1, sub-pixels 951 and 952 of pixels 950 achieve higher low-light sensitivity during night time or low light driving conditions, than if the IR cut-off filter were employed.

Figure 6:
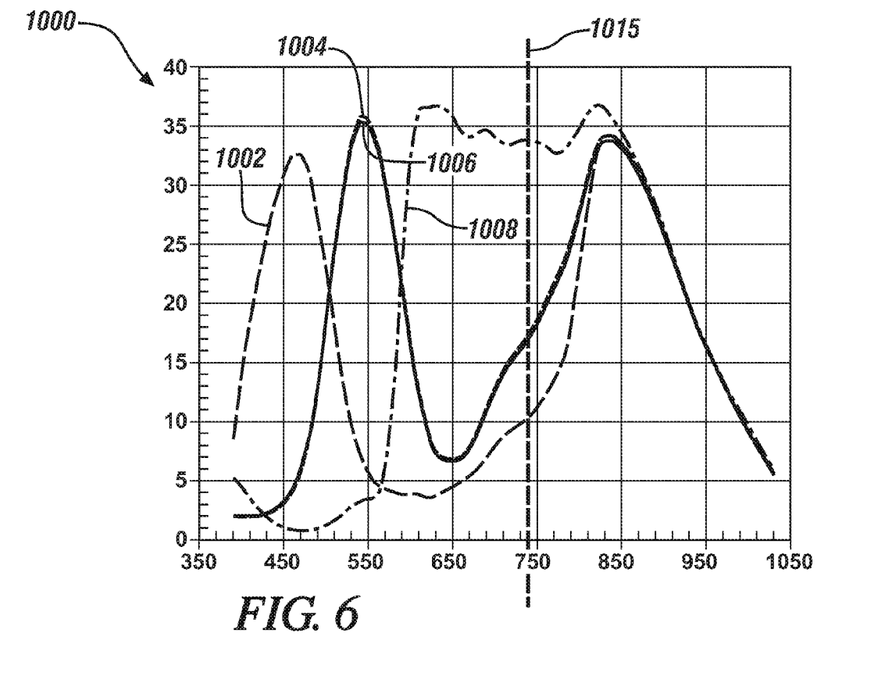
FIG. 6 illustrates a plot of quantum efficiency response profiles of a plurality of colors with respect to wavelength for a split sub-pixel imaging ship including application of an IR-pass filter coating on selected sub-pixels, in accordance with the present disclosure.

FIG. 6 illustrates a non-limiting plot 1000 of QE response profiles of a plurality of colors with respect to wavelength for an exemplary split sub-pixel imaging chip including application of an IR-pass filter coating on selected sub-pixels, in accordance with the present disclosure. The horizontal x-axis denotes wavelength (nm) and the vertical y-axis denotes response, i.e., QR response (%). The QE response profiles for the plurality of colors include blue (B), green (Gb), green (Gr) and red (R) pixel response profiles 1002, 1004, 1006, 1008, respectively. Dashed vertical line 1015 denotes a predetermined wavelength, e.g., 720 nm, at which an IR-pass filter coating is applied to selected ones of long-exposure and short-exposure split-sub-pixels in each of the Gr and Gb pixels. The IR-pass filter coating may block all visible light within the visible spectrum range. For purposes of this disclosure, the terms "visible light" and "color information" will be used interchangeably. It will be understood that the region to the right of dashed vertical line 1015 denotes an IR region, e.g., close to a grey-scale image, of enhanced image sensitivity information and the region to the left of the dashed vertical line 1015 denotes a true color or visible region of enhanced color information. As illustrated in the non-limiting plot 1000, the color information blocked by the IR-pass filter coating on the selected sub-pixels for the Gr and Gb pixels can be reconstructed within the visible range by subtracting the QE response of the selected sub-pixels (i.e., an IR-pass filter QE response) from the QE response (i.e., a non-IR-pass filter QE response) of the remaining sub-pixels not having the IR-pass filter coating applied thereto for the Gr and Gb pixels. As used herein, the term "IR-pass filter QE response" refers to accumulated intensity of the selected sub-pixels having the IR-pass filter coating applied thereto and the term "non-IR-pass filter QE response" refers to accumulated intensity of the remaining sub-pixels not having the IR-pass filter coating applied thereto. For instance, accumulated intensity of the selected sub-pixels (i.e., the IR-pass filter QE response) is subtracted from the accumulated intensity of the remaining sub-pixels (i.e., the non-IR-pass filter QE response) for the Gr and Gb pixels. The reconstruction of the color information for the Gr and Gb pixels effectively separates image sensitivity information and color information.

Additionally, the IR-pass filter QE response of the selected sub-pixels can be used to approximate an IR-pass filter QE response for each of the sub-pixels for the R and B pixels using the respective QE response profiles 1002-1008 depicted in the non-limiting plot 1000. Specifically, the accumulated intensity of the selected sub-pixels having the IR-pass filter applied thereto is used to approximate the accumulated intensity for each of the sub-pixels for the R and B pixels not having the IR-pass filter coating applied thereto. It will be understood that methods such as interpolation can be utilized to compensate for the differences between the QE response profiles such that accurate approximations can be obtained. For instance, because selected ones sub-pixels having the IR-pass filter coating applied thereto are very close to neighboring R, B, G sub-pixels, assumptions can be made that accumulated intensity on these neighboring sub-pixels not having the IR-pass filter coating applied thereto are very similar. Thus, accumulated intensity from the selected ones of sub-pixels having the IR-pass filter coating applied thereto can be used to approximate the accumulated intensity of the neighboring sub-pixels as if an IR-pass filter coating were applied even though no such application exists. As used herein, the term "approximated IR-pass filter QE response" refers to a QE response associated with an accumulated intensity indicative of the IR-pass filter being applied to corresponding sub-pixels even though no such application exists. As used herein, the term "corresponding sub-pixels" refers to sub-pixels of the same one of long-exposure and short-exposure times. Thereafter, the approximated IR-pass filter QE response obtained for respective ones of the R and B pixels can be used to reconstruct the color information in the visible spectrum range for the corresponding pixels such that image sensitivity information and color information are effectively separated. Accordingly, enhanced low-light image sensitivity as well as correct color information can be obtained using the exemplary split sub-pixel imaging chip including application of the IR-pass filter coating on selected sub-pixels.

Figure 7:
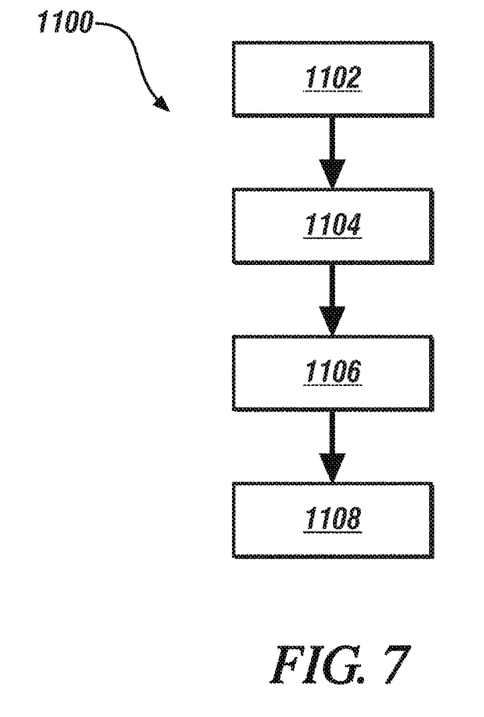
FIG. 7. illustrates an exemplary flowchart for enhancing image sensitivity and color information for an image captured by the camera device of FIG. 1 using the exemplary split sub-pixel imaging chip of FIG. 5, in accordance with the present disclosure

FIG. 7 illustrates an exemplary flowchart 1100 for enhancing image sensitivity and color information for an image captured by the camera device of FIG. 1 using the exemplary split sub-pixel imaging chip 900 of FIG. 5, in accordance with the present disclosure. The exemplary flowchart 1100 will be described with reference to the non-limiting plot 1000 of QE response profiles 1002-1008 illustrated in FIG. 6. Table 1 is provided as a key to FIG. 6 wherein the numerically labeled blocks and the corresponding functions are set forth as follows.

TABLE 1

| BLOCK | BLOCK CONTENTS |
|---|---|
| 1102 | Applying an IR-pass filter coating on selected sub-pixels of the split sub-pixel imaging chip 900. |
| 1104 | Reconstructing color information within a visible spectrum range for the long-exposure and short-exposure sub-pixels for all pixels corresponding to a selected color based on the selected sub-pixels having the IR-pass filter coating applied thereto. |
| 1106 | Reconstructing color information within the visible spectrum range for the long-exposure and short-exposure sub-pixels for all pixels corresponding to a first color based on the selected sub-pixels having the IR-pass filter coating applied thereto. |
| 1108 | Reconstructing color information within the visible spectrum range for the long-exposure and short-exposure sub-pixels for all pixels corresponding to a second color based on the selected sub-pixels having the IR-pass filter coating applied thereto. |

The camera device 100 of FIG. 1 includes lens element 28 that transmits light to the split sub-pixel imaging chip 900 (e.g., imaging chip 44). At block 1102, the IR-pass filter coating 975 is applied on selected sub-pixels 951 and 952 of the split sub-pixel imaging chip 900. Specifically, the IR-pass filter coating is applied only on selected ones of the sub-pixels for only selected ones of the pixels corresponding to a selected color. In the illustrated embodiment of FIG. 5, the selected color includes green (Gr and Gb pixels); however, embodiments herein can equally be applied when the selected color includes either one of red and blue. The IR-pass filter coating allows infrared light to be transmitted through the selected sub-pixels within a predetermined portion of wavelengths while blocking transmission of visible light including color information through the selected sub-pixels. In the illustrated non-limiting plot 1000 of FIG. 6, the predetermined portion of wavelengths includes all wavelengths exceeding a predetermined wavelength, e.g., 720 nm. The predetermined portion of wavelengths can include all wavelengths within a predetermined range of wavelengths, e.g., 720-950 nm in other embodiments. It will be understood that infrared light is allowed to be transmitted through sub-pixels not having the IR-pass filter coating 975 applied thereto; however, color information is not blocked in these un-selected sub-pixels. Moreover, the exemplary IR cut-off filter 40 is not included in the camera device 100 of FIG. 1, such that IR light is enabled to be transmitted to the split sub-pixel imaging chip 900. Described in detail in blocks 1104-1108 below, color information within the visible spectrum range can be reconstructed for the long-exposure and short-exposure sub-pixels 952, 951, respectively, for the plurality of color-sensitive pixels 950 based on the applied IR-pass filter coating 975 on the selected sub-pixels corresponding to the selected color. It will be appreciated that blocks 1104-1108 can be executed by the exemplary non-transitory processing device 48 of FIG. 1 which can further access QE response profiles and associated accumulated intensities for a plurality of colors, such as the QE response profiles illustrated in the non-limiting plot 1000 of FIG. 6.

Referring to block 1104, color information within the visible spectrum range for the long-exposure and short-exposure sub-pixels 952, 951, respectively, for all pixels corresponding to the selected color (e.g., green) are reconstructed based on the selected sub-pixels having the IR-pass filter coating 975 applied thereto. Reconstructing color information for the long-exposure and short-exposure sub-pixels for all pixels corresponding to the selected color can be expressed as follows.

$$C_{L\_selected} = (I_{nonIR})_{L\_selected} - (I_{IR})_{L\_selected} \qquad [1]$$

$$C_{S\_selected} = (I_{nonIR})_{S\_selected} - (I_{IR})_{S\_selected} \qquad [2]$$

wherein $C_{L\_selected}$ and $C_{S\_selected}$ represent reconstructed color information for the long-exposure and short-exposure sub-pixels corresponding to the selected color, respectively, $(I_{nonIR})_{L\_selected}$ and $(I_{nonIR})_{S\_selected}$ represent accumulated intensity of long- and short-exposure sub-pixels corresponding to the selected color, respectively, not having the IR-pass filter coating applied, and $(I_{IR})_{L\_selected}$ and $(I_{IR})_{S\_selected}$ represent accumulated intensity of long- and short-exposure sub-pixels corresponding to the selected color, respectively, having the IR-pass filter coating applied.

For the long-exposure sub-pixels 952 for all pixels corresponding to the selected color (e.g., all the green Gr and Gb pixels), the color information within the visible spectrum range can be reconstructed utilizing Equation [1] by subtracting an IR-pass filter QE response of one of the selected long-exposure sub-pixels having the IR-pass filter coating applied thereto from a non-IR-pass filter QE response of one of the long-exposure sub-pixels not having the IR-pass filter coating applied thereto and corresponding to the selected color. Specifically, accumulated intensity of one of the selected long-exposure sub-pixels having the IR-pass filter coating applied thereto is subtracted from accumulated intensity of one of the long-exposure sub-pixels not having the IR-pass filter coating applied there to and corresponding to the selected color. Block 1104 similarly reconstructs the color information within the visible spectrum range for the short-exposure sub-pixels 951 corresponding to the selected color using Equation [2].

It will be understood that the IR-pass filter QE response corresponding to the selected color only includes image sensitivity information within the predetermined portion of wavelengths while the non-IR-pass filter QE response corresponding to the selected color includes image sensitivity information convoluted with color information. Thus, subtracting the IR-pass filter QE response from the non-IR-pass filter response enables image intensity/sensitivity information to be removed from the IR spectrum such that true color information can be obtained through reconstruction for all sub-pixels for pixels corresponding to the selected color.

Referring to block 1106, color information within the visible spectrum range for the long-exposure and short-exposure sub-pixels 952, 951, respectively, for all pixels corresponding to a first color are reconstructed based on the selected sub-pixels corresponding to the selected color having the IR-pass filter coating 975 applied thereto. In the illustrated embodiment of FIG. 5, when the selected color includes green, the first color can include red or blue. It will be appreciated that no sub-pixels for the pixels corresponding to the first color include application of the IR-pass filter coating. However, approximations can be accordingly obtained that are indicative of sub-pixels corresponding to the first color having the IR-pass filter coating applied thereto by referencing IR-pass filter QE responses and associated accumulated intensities of selected sub-pixels having the IR-pass filter actually applied thereto. For instance, an approximated IR-pass filter QE response for the long-exposure sub-pixels corresponding to the first color indicative of having the IR-pass filter coating applied thereto can be obtained within the predetermined portion of wavelengths using the IR-pass filter QE response of one of the selected long-exposure sub-pixels corresponding to the selected color having the IR-pass filter actually applied thereto. Such approximations are possible because QE responses within the IR-region to the right of dashed vertical line 1015 are similar for each of the QE response profiles 1002-1008 as illustrated in the non-limiting plot 1000 of FIG. 6. Simple interpolations and compensations can be made to approximate the IR-pass filter QE response for the first color (e.g., red) using the IR-pass filter QE response for the selected color (e.g., green) that is actually obtained. Similarly, an approximated IR-pass filter QE response for the short-exposure sub-pixels corresponding to the first color can be obtained using the same method adapted for short-exposure sub-pixels.

The approximated IR-pass filter QE response obtained for each of the long-exposure and short sub-pixels corresponding to the first color now includes image sensitivity information within the predetermined portion of wavelengths that is separated from color information. Substantially similar to Equations [1] and [2], reconstructing color information for the long-exposure and short-exposure sub-pixels for all pixels corresponding to the first color can be expressed as follows.

$$C_{L\_first} = (I_{nonIR})_{L\_first} - (I_{IR\_approx})_{L\_selected} \qquad [3]$$

$$C_{S\_selected} = (I_{nonIR})_{S\_selected} - (I_{IR\_approx})_{S\_selected} \qquad [4]$$

wherein $C_{L\_first}$ and $C_{S\_first}$ represent reconstructed color information for the long-exposure and short-exposure sub-pixels corresponding to the first color, respectively, $(I_{nonIR})_{L\_first}$ and $(I_{nonIR})_{S\_first}$ represent accumulated intensity of long- and short-exposure sub-pixels corresponding to the first color, respectively, not having the IR-pass filter coating applied, and $(I_{IR\_approx})_{L\_selected}$ and $(I_{IR\_approx})_{S\_selected}$ represent approximated accumulated intensity of long- and short-exposure sub-pixels corresponding to the first color, respectively, indicative of having the approximated IR-pass filter coating applied.

For the long-exposure sub-pixels corresponding to the first color, the color information can be reconstructed within the visible spectrum range using Equation [3] by subtracting the approximated IR-pass filter QE response from an actual non-IR-pass filter response of a corresponding one of the long-exposure sub-pixels corresponding to the first color. Specifically, accumulated intensity of one of the long-exposure sub-pixels associated with the approximated IR-pass filter QE response is subtracted from accumulated intensity of one of the long-exposure sub-pixels not having the IR-pass filter coating applied there to and corresponding to the first color. Block 1106 similarly reconstructs the color information within the visible spectrum range for the short-exposure sub-pixels 951 corresponding to the first color using Equation [4].

It will be understood that the approximated IR-pass filter QE response corresponding to the first color only includes image sensitivity information within the predetermined range while the actual non-IR-pass filter response corresponding to the first color includes image sensitivity information convoluted with color information. Thus, subtracting the approximated IR-pass filter QE response from the actual non-IR-pass filter response enables image sensitivity information to be removed such that true color information can be obtained through reconstruction for all sub-pixels for pixels corresponding to the first color (e.g., red).

Referring to block 1108, color information within the predetermined portion of wavelengths for the long-exposure and short-exposure sub-pixels 952, 951, respectively, for all pixels corresponding to a second color are reconstructed based on the selected sub-pixels corresponding to the selected color having the IR-pass filter coating 975 applied thereto. In the illustrated embodiment of FIG. 5, when the selected color includes green, the first color can include red or blue and the second color can include the other one of red or blue. Block 1108 approximates IR-pass filter QE responses for the long-exposure and short sub-pixels corresponding to the second color using methods adapted for the second color that are substantially identical to those described above with reference to that Block 1106.

Block 1108 further reconstructs color information within the visible spectrum range for the long-exposure and short-exposure sub-pixels corresponding to the second color using equations adapted for the second color substantially identical to those described above with reference to Equations [3] and [4] of Block 1106. Thus, Blocks 1106 and 1108 can be performed in parallel.

The exemplary flowchart 1100 of FIG. 7 reveals that application of the IR-pass filter on selected sub-pixels enables image sensitivity information to be directly obtained in the selected sub-pixels corresponding to the selected color that is separated from color information. Furthermore, true color information in the corresponding pixels can be reconstructed by subtracting the image sensitivity information from convoluted information that includes both color information and sensitivity information. Additionally, the obtained image sensitivity information of the selected pixels can be used to approximate image sensitivity information for the other pixels corresponding to the first or second colors. Lastly, true color information in the pixels corresponding to the first or second colors can be reconstructed by subtracting the approximated image sensitivity information. Accordingly, enhanced low-light image sensitivity as well as correct color information can be obtained using the exemplary split sub-pixel imaging chip 900 including application of the IR-pass filter coating on selected sub-pixels. Added IR night vision could be additionally utilized to increase visibility during night time driving and increased low-light sensitivity can reduce exposure time, thereby reducing motion blurring in a captured image. In an exemplary embodiment, the image captured by the camera device 100 is a high dynamic range (HDR) image.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Apparatus for capturing an image, comprising:
   a plurality of lens elements coaxially encompassed within a lens housing;
   a split sub-pixel imaging chip including an IR-pass filter coating applied on selected sub-pixels, the sub-pixels including a long-exposure sub-pixel and a short-exposure sub-pixel for each of a plurality of green, blue and red pixels; and
   a processing device configured to reconstruct color information within a visible light spectrum for each of the green, red and blue pixels based on obtained quantum efficiency responses of the selected sub-pixels having the IR-pass filter coating applied thereto, wherein the color information within the visible light spectrum for each of the green, red and blue pixels is reconstructed based on accumulated intensity of the selected sub-pixels having the IR-pass filter coating applied thereto using the obtained quantum efficiency responses.

2. The apparatus of claim 1, wherein the IR-pass filter coating is applied on selected ones of the sub-pixels for only selected ones of the pixels corresponding to a selected color.

3. The apparatus of claim 2, wherein the selected color comprises green.

4. The apparatus of claim 1, wherein the IR-pass filter coating allows transmission of near infrared light within a predetermined range of wavelengths through the selected sub-pixels while blocking visible light comprising color information.

5. The apparatus of claim 1, wherein the IR-pass filter coating allows transmission of near infrared light exceeding a predetermined wavelength through the selected sub-pixels while blocking visible light comprising color information.

6. Method for enhancing image sensitivity and color information for an image captured by a camera device using a split sub-pixel imaging chip including a plurality of color-sensitive pixels each including a long-exposure sub-pixel and a short-exposure sub-pixel, comprising:
   applying an IR-pass filter coating on selected sub-pixels, comprising applying the IR-pass filter coating only on selected ones of the long-exposure and short-exposure sub-pixels for only selected ones of the pixels corresponding to a selected color, the IR-pass filter coating allowing near infrared light within a predetermined portion of wavelengths to be transmitted through the selected sub-pixels while blocking transmission of visible light comprising color information through the selected sub-pixels; and
   reconstructing color information within a visible spectrum range for the long-exposure and short-exposure sub-pixels for the plurality of color-sensitive pixels based on the applied IR-pass filter coating on the selected sub-pixels, comprising:
   for the long-exposure sub-pixels for all pixels corresponding to the selected color, reconstructing the color information within the visible spectrum range based on subtracting a response of one of the selected long-exposure sub-pixels having the IR-pass filter coating applied thereto from a response of one of the long-exposure sub-pixels not having the IR-pass filter coating applied thereto and corresponding to the selected color; and
   for the short-exposure sub-pixels for all pixels corresponding to the selected color, reconstructing the color information within the visible spectrum range based on subtracting a response of one of the selected short-exposure sub-pixels having the IR-pass filter coating applied thereto from a response of one of the short-exposure sub-pixels not having the IR-pass filter coating applied thereto and corresponding to the selected color.

7. The method of claim 6, further comprising:
   reconstructing color information within visible spectrum range for the long-exposure and short-exposure sub-pixels for all pixels corresponding to a first color based on the IR-pass filter applied only on the selected ones of the long-exposure and short-exposure sub-pixels.

8. The method of claim 7, wherein reconstructing color information within the visible spectrum range for the long-exposure and short-exposure sub-pixels for all pixels corresponding to the first color, comprises:
for the long-exposure sub-pixels corresponding to the first color:
approximating a response indicative of having the IR-pass filter applied thereto using the response of one of the selected long-exposure sub-pixels having the IR-pass filter coating applied thereto;
reconstructing the color information within the predetermined portion of wavelengths based on subtracting the approximated response from an actual response of a corresponding one of the long-exposure sub-pixels corresponding to the first color;
for the short-exposure sub-pixels corresponding to the first color:
approximating a response indicative of having the IR-pass filter applied thereto using the response of one of the selected short-exposure sub-pixels having the IR-pass filter coating applied thereto; and
reconstructing the color information within the visible spectrum range based on subtracting the approximated response from an actual response of a corresponding one of the short-exposure sub-pixels corresponding to the first color.

9. The method of claim 7, further comprising:
reconstructing color information within the visible spectrum range for the long-exposure and short-exposure sub-pixels for all pixels corresponding to a second color based on the IR-pass filter applied only on the selected ones of the long-exposure and short-exposure sub-pixels.

10. The method of claim 9, further comprising:
for the long-exposure sub-pixels responsive to the second color:
approximating a response indicative of having the IR-pass filter applied thereto using the response of one of the selected long-exposure sub-pixels having the IR-pass filter coating applied thereto;
reconstructing the color information within the visible spectrum range based on subtracting the approximated response from an actual response of a corresponding one of the long-exposure sub-pixels corresponding to the second color;
for the short-exposure sub-pixels corresponding to the second color:
approximating a response indicative of having the IR-pass filter applied thereto using the response of one of the selected short-exposure sub-pixels having the IR-pass filter coating applied thereto; and
reconstructing the color information within the visible spectrum range based on subtracting the approximated response from an actual response of a corresponding one of the short-exposure sub-pixels corresponding to the second color.

11. The method of claim 9, wherein the selected color, the first color and the second color each comprise different ones of green, red and blue.

12. The method of claim 6, wherein the selected color comprises green.

13. The method of claim 6, wherein the predetermined portion of wavelengths comprises one of:
all wavelengths exceeding a predetermined wavelength; and
all wavelengths within a predetermined range of wavelengths.

14. Apparatus for capturing an image, comprising:
a split sub-pixel imaging chip receiving light transmitted through the aspheric lens element and including a plurality of green, blue and red pixels each including a long-exposure sub-pixel and a short-exposure sub-pixel, the split sub-pixel imaging chip includes an IR-pass filter coating applied on selected ones of the long-exposure and short-exposure sub-pixels for selected ones of the green pixels; and
a processing device configured to reconstruct color information within a visible light spectrum for each of the green, red and blue pixels based on obtained quantum efficiency responses of the selected sub-pixels having the IR-pass filter coating applied thereto, wherein the color information within the visible light spectrum for each of the green, red and blue pixels is reconstructed based on accumulated intensity of the selected sub-pixels having the IR-pass filter coating applied thereto using the obtained quantum efficiency responses.

15. The apparatus of claim 14, wherein the IR-pass filter coating is configured to allow transmission of near-infrared light exceeding a predetermined wavelength through the selected sub-pixels while blocking transmission of visible light comprising color information through the selected sub-pixels.

16. The apparatus of claim 14, further comprising:
a plurality of lens elements coaxially encompassed within a lens housing.

* * * * *